(12) United States Patent
Krogstrup et al.

(10) Patent No.: US 10,669,647 B2
(45) Date of Patent: Jun. 2, 2020

(54) NETWORK OF NANOSTRUCTURES AS GROWN ON A SUBSTRATE

(71) Applicant: University of Copenhagen, Copenhagen K (DK)

(72) Inventors: Peter Krogstrup, Copenhagen Ø (DK); Charles Marcus, Copenhagen Ø (DK); Thomas Sand Jespersen, Copenhagen Ø (DK); Jesper Nygård, Copenhagen Ø (DK)

(73) Assignee: University of Copenhagen (DK)

( * ) Notice: Subject to any disclaimer, the term of this patent is extended or adjusted under 35 U.S.C. 154(b) by 32 days.

(21) Appl. No.: 15/736,422

(22) PCT Filed: Jun. 27, 2016

(86) PCT No.: PCT/EP2016/064787
§ 371 (c)(1),
(2) Date: Dec. 14, 2017

(87) PCT Pub. No.: WO2016/207415
PCT Pub. Date: Dec. 29, 2016

(65) Prior Publication Data
US 2018/0195201 A1    Jul. 12, 2018

(30) Foreign Application Priority Data
Jun. 26, 2015 (EP) .................. 15174142

(51) Int. Cl.
*C30B 11/12* (2006.01)
*C30B 29/60* (2006.01)
(Continued)

(52) U.S. Cl.
CPC .............. *C30B 11/12* (2013.01); *C30B 29/60* (2013.01); *C30B 29/66* (2013.01); *H01L 21/02603* (2013.01)

(58) Field of Classification Search
CPC ......... H01L 2924/0002; H01L 2924/00; H01L 21/28562; H01L 21/28581;
(Continued)

(56) References Cited

U.S. PATENT DOCUMENTS 5,057,485 A    10/1991  Nishino et al.
2002/0163079 A1*  11/2002  Awano ................... B82Y 10/00
                                                                257/750
(Continued)

FOREIGN PATENT DOCUMENTS

WO    WO 03/019683 A2    3/2003
WO    WO 2007/136412    11/2007
(Continued)

OTHER PUBLICATIONS

Dick, Epitaxial Growth and Design of Nanowires and Complex Nanostructures, Lund University, Doctoral Thesis, 89 pages, Apr. 2007.
(Continued)

*Primary Examiner* — Edward Chin
(74) *Attorney, Agent, or Firm* — Sunstein LLP (57) ABSTRACT

The present disclosure relates to a method for producing a network of interconnected nanostructures comprising the steps of: providing a substantially plane substrate; growing a plurality of elongated nanostructures from the substrate; kinking the growth direction of at least a part of the nanostructures such that at least part of the kinked nanostructures are growing in a network plane parallel to the substrate, and creating one or more network(s) of interconnected kinked nanostructures in the network plane, wherein a dielectric support layer is provided below the network plane to support said network(s) of interconnected nanostructures.

18 Claims, 8 Drawing Sheets

(51) Int. Cl.
*C30B 29/66* (2006.01)
*H01L 21/02* (2006.01)

(58) Field of Classification Search
CPC ......... H01L 21/76838; H01L 21/76879; H01L 2221/1094; H01L 23/53276; H01L 29/42316; H01L 29/475; H01L 29/66431; H01L 29/66454; H01L 29/77
See application file for complete search history.

(56) References Cited

U.S. PATENT DOCUMENTS

| | | | |
|---|---|---|---|
| 2002/0179937 A1 | 12/2002 | Ivanov et al. | |
| 2003/0042481 A1 | 3/2003 | Tzalenchuk et al. | |
| 2006/0134883 A1 | 6/2006 | Hantschel et al. | |
| 2007/0212522 A1* | 9/2007 | Heidari | B82Y 10/00 428/141 |
| 2014/0342236 A1 | 11/2014 | Goyal | |
| 2017/0160473 A1* | 6/2017 | Mazur | G02B 6/1225 |

FOREIGN PATENT DOCUMENTS

| | | |
|---|---|---|
| WO | WO 2008/073529 A2 | 6/2008 |
| WO | WO 2013/098657 | 7/2013 |
| WO | WO 2014/105569 | 7/2014 |
| WO | WO 2014/165634 | 10/2014 |
| WO | WO 2014/189769 | 11/2014 |
| WO | WO 2015/049349 | 4/2015 |

OTHER PUBLICATIONS

Dowdy et al., "Realization of Unidirectional Planar GaAs Nanowires on GaAs (110) Substrates," IEEE Electron Device Letters, vol. 33, No. 4, pp. 522-524, Apr. 2012.
Dowdy et al., "Relationship between planar GaAs nanowire growth direction and substrate orientation," Nanotechnology, vol. 24, No. 3, 6 pages, 2013.
International Searching Authority, International Search Report—International Application No. PCT/EP2016/064787, dated Aug. 22, 2016 together with the Written Opinion of the International Searching Authority, 10 pages.
Tian et al., "Three-Dimensional, Flexible Nanoscale Field-Effect Transistors as Localized Bioprobes," Science, vol. 329, No. 5993, pp. 830-834, Aug. 13, 2010.
Ungaretti, "III-V Semiconductor Nanowires growth and characterization," Copenhagen University, Master's Thesis, 67 pages, Aug. 2014.
Belzig, "Device Physics: Super semiconducting Nanowires," Nature Nanotechnology, vol. 1, 2 pages, Dec. 2006.
Chang, "Superconducting Proximity Effect in InAs Nanowires," Harvard University, 192 pages, Jun. 2014.
De Boeck, et al., "Hybrid epitaxial structures for spintronics," Thin Solid Films, vol. 412, pp. 3-13, 2002.
Frolov, et al., "Quantum computing based on semiconductor nanowires," MRS Bulletin, vol. 38, pp. 809-815, Oct. 2013.
Krogstrup, et al., "Semiconductor—Superconductor Nanowire Epitaxy," Center for Quantum Devices, 26 pages, 2014.
Leonard, et al., "Electrical contacts to one- and two-dimensional nanomaterials," Nature Nanotechnology, vol. 6, pp. 773-783, Dec. 2011.
Mourik, et al., "Signatures of Majorana Fermions in Hybrid Superconductor-Semiconductor Nanowire Devices," Science, vol. 336, pp. 1003-1007, May 25, 2012.
Nadj-Perge, et al., "Spin-orbit qubit in a semiconductor nanowire," Nature, vol. 468, 11 pages, Dec. 23, 2010.
Petersson, et al., "Superconducting qubits with semiconductor nanowire Josephson junctions," Abstract Submitted for MAR15 Meeting of the American Physical Society, 1 page, 2014.
Roddaro, et al., "Hot-Electron Effects in InAs Nanowire Josephson Junctions," Nano Res., vol. 4, No. 3, pp. 259-265, 2011.
Rokhinson, et al., "The fractional a.c. Josephson effect in a semiconductor-superconductor nanowire as a signature of Majorana particles," Nature Physics, vol. 8, pp. 795-799, Nov. 2012.
Xiang, et al., "Ge/Si nanowire mesoscopic Josephson junction," Nature Nanotechnology, vol. 1, pp. 208-213, Dec. 2006.
Yang, et al., "Growth of alkali halides by molecular-beam epitaxy," Physical Review B, vol. 41, No. 12, 14 pages, Apr. 15, 1990.
Ziino, "Analysis of InAs-nanowires coated with Al by high-resolution TEM and energy dispersive X-ray spectroscopy," 19 pages, Sep. 2, 2012.
Ziino, et al., "Epitaxial aluminum contacts to InAs nanowires," https://arxiv.org/abs/1309.4569, 14 pages, Sep. 18, 2013.
International Searching Authority, European Patent Office, International Search Report and Written Opinion, International Application No. PCT/EP2015/054522, 15 pages, dated May 27, 2015.
International Searching Authority, European Patent Office, International Search Report and Written Opinion, International Appl. No. PCT/EP2015/065110, 15 pages, dated Oct. 14, 2015.

* cited by examiner

NETWORK OF NANOSTRUCTURES AS GROWN ON A SUBSTRATE

The present invention relates to a method of providing a network of elongated nanostructures as grown on a substrate, and a corresponding device provided therefrom.

BACKGROUND OF INVENTION

Nanowire networks have applications in quantum computing, bio-sensing, photovoltaics and nano-lasers, just to name a few. In recent years, there has been an increasing interest in growth parameters and growth kinetics of nanowires. Devices with nanowire networks are a new type of devices, especially when they are electrically contacted, thereby for example providing an electrical circuit, i.e. when a contacting material is deposited on the nanowire network.

In order to make electrically contacted network, one method is to initially grow a set of elongated nanowires on a substrate, physically remove them from the substrate and arrange them in parallel columns, or alternatively in a non-ordered web such that nanowires intersect at random positions. A metallic layer can then be deposited directly upon the silicon substrate in a way such that the metallic layer does not contact the base of the nanowires. Finally the nanowires and the metallic layer can be removed. Prior to deposition of the metallic layer, a pre-treatment of the nanowires may be required, for example in order for an electrical contact layer to bond with the nanowires.

This prior art method suffers from several problems. First of all, growing nanowires on one substrate and manipulating nanowires onto another substrate takes time, especially when manufacturing a large network. Secondly, placing a metallic layer in a way so that the metallic layer does not contact the base of the nanowires is difficult and requires great effort, especially also because the nanowires that need to be connected has to be controlled by the metallic layer. Having a non-ordered web requires much more attention with respect to contacting the material with a metallic layer, in comparison to an ordered web, especially if an ordered connection must be established.

Thus, several problems exist in manufacturing a nanowire network, and also in the way a nanowire network is electrically contacted. Accordingly, there is a need to improve the manufacturing process of nanowire networks and a need to improve the way a nanowire network is electrically contacted.

SUMMARY OF INVENTION

The present disclosure relates in a first aspect to a method for producing a network of interconnected nanostructures comprising the steps of: providing a substantially plane substrate; growing a plurality of elongated nanostructures from the substrate; kinking the growth direction of at least a part of the nanostructures such that at least part of the kinked nanostructures are growing in a network plane parallel to the substrate.

The advantage of having nanostructures growing in the same plane is that some of these kinked nanostructures most likely will intersect which can result in one or more networks of interconnected nanostructures. The intersecting nanowires will typically covalently bond at their intersection. Under appropriate growth conditions an epitaxial registry between the substrate and nanostructures will be maintained in the connections. If for example the nanostructures are single crystal and the crystal symmetry of the nanostructure has the same or higher symmetry as the substrate (along the substrate normal) then nanostructure intersections will be epitaxial.

A dielectric support layer can be provided below the network plane to support the kinked part of the nanostructures. This dielectric support layer can be provided such that at least a part of the kinked nanostructures grow directly on the support layer. Alternatively the dielectric support layer can be provided after the kinked nanostructures have been grown. If one or more network(s) of interconnected kinked nanostructures are created in the network plane, the network(s) of interconnected kinked nanostructures can be supported by the dielectric support layer. The major advantage of the present invention is that the dielectric support layer thereby can form a new plane substrate whereon the network(s) of interconnected kinked nanostructures are created. And due to the dielectric properties the network is only conductively connected in the network plane through the interconnections between kinked nanostructures, such that one or more electrical networks and/or circuits can be created by means of the network(s) of interconnected nanostructures. However, networks of nanostructures conductively connected through several parallel network planes can also be realized with the presently disclosed method.

Depending on the choice of substrate crystal orientation and the growth directions of the nanostructures, the formation of epitaxial nanostructure connections can be controlled to form multiply connected epitaxial networks. Epitaxy inherent to the nanostructures can hence be retained throughout the network(s) of interconnected kinked nanostructures. Such networks can be subject to subsequent lithographic processing (additive or subtractive) for larger-scale fabrication of electronic and optical devices. In particular the present disclosure therefore presents a new concept for creating small, multiply connected networks of semiconductor nanowires. And epitaxy can be retained throughout the network.

The order of the steps in this method may be interchanged. The dielectric support layer may be applied to the substrate after growth of the elongated nanostructures but before the step of kinking the growth direction. Or the dielectric support layer may be applied to the substrate after the network(s) of interconnected kinked nanostructures have been created. If the dielectric support layer is a resist material and the support layer is applied by means of e.g. resist spinning, the support layer may be applied after growth of the elongated nanostructure. Alternatively the dielectric support layer is applied to the substrate before growth of the elongated nanostructures. E.g. it is relatively straightforward to cover a substrate with a dielectric support layer initially, e.g. a $SiO_2$ layer. In order to grow the elongated nanostructures it may then be necessary to remove the support layer from the substrate in predefined areas to create recesses/dints, e.g. by means of lithography, from where the elongated nanostructures can grow. The elongated nanostructures can then be grown from the substrate in at least a part of said predefined areas, e.g. one nanostructure in one recess, because the material of the support layer can be selected such that the material of the nanostructures does not stick during growth. Another alternative is if the substrate itself, or at least the surface layer of the substrate, is a dielectric, e.g. an insulating material, in itself. In that case recesses/dints/holes can be formed in the top surface of the substrate, the elongated nanostructures can be grown initially from these recesses/dints/holes, and when the height of the nanostructures corresponds to the surface of the substrate the growth direction of the nanostructures can be kinked, such that the nanostructures grow parallel and substantially directly on top of the surface of the substrate, such that the surface of substrate itself forms the support layer for the network of nanostructures. Common to these methods for providing a support layer for a network of interconnected nanostructures is that the support layer is part of the same growth process as the elongated nanostructures, either by having the support layer on or as part of the substrate initially or by applying the support layer to the substrate during or after growth, such that one or more networks of e.g. nanowires "as grown" on a substrate can be provided. I.e. the support layer is provided on the same substrate on where the elongated nanostructures were grown. The presently disclosed method may be realized by means of molecular beam epitaxy (MBE) and vapor liquid solid (VLS) growth.

With a support layer to support the network(s) of nanostructures a manufacturing process is provided that solves the problems outlined in the previous section. First of all, the present disclosure provides a solution for easily manufacturing a network of interconnected structures, where the nanowires do not need to be grown separately from the plane substrate and then attached to the plane substrate. On the contrary, the nanowires in the present disclosure are grown directly on the substrate. A method for providing an ordered web, or network, i.e. parallel to the substrate is further disclosed. By having a support layer as described above, there is first of all provided means for supporting the network above or on the plane substrate. In order words, there is provided a supporting layer to avoid the network collapsing. Further, the support layer may be responsible for protecting or isolating the base of the nanowires, for example such that a contact layer, for example deposited on the support layer, cannot physically get in contact with the base of the nanowires. In this way is disclosed how to specifically have a contact layer that does not contact the base of the nanowires. Even further, a contact layer, for example deposited on the support layer, provides a solution on how to contact the nanowires. Thus, the present disclosure improves the way to electrically contact a nanowire network. Since the network is grown on the substrate, there may not be need for removing the network from the substrate, and the present disclosure therefore relates to a method for efficiently producing a network of nanowires as grown on a substrate.

The substrate is preferably a crystalline substrate in order to make the elongated nanostructures grow in an epitaxial relation to the crystalline substrate. Kinking the growth direction will make a crystalline elongated nanostructures grow in one of the possible crystal directions parallel to the crystalline substrate.

A second aspect of the present disclosure relates to a nanowire network produced by the above described method.

In a third aspect of the present disclosure, there is provided a network of interconnected nanowires, wherein the at least a part of the nanowires comprise a crystalline semiconductor nanostructure and a crystalline structured first facet layer of a of superconductor material and wherein the crystalline structure of the semiconductor nanostructure is epitaxially matched with the crystalline structure of the first facet layer on the interface between the two crystalline structures.

Having the crystalline structure of the semiconductor nanostructure epitaxially matched with the crystalline structure of the first facet layer on the interface between the two crystalline structures, allows for network of interconnected nanowires having epitaxially matched interfaces. These epitaxially matched interfaces can be regarded as the ultimate limit of metal contacts to semiconductors. The nanostructures may thus provide a conceptually new route towards nanowire electronics as it solves the general problem of forming electrical nanowire/metal contacts.

In a fourth aspect of the present disclosure, there is provided a nanowire circuit, comprising: a dielectric support layer forming a slab; and a plurality of nanowires, each nanowire having a substantially vertical section in the slab and a horizontal section on the slab, wherein at least a part of the horizontal sections are interconnected to form a network of nanowires.

Such a nanowire circuit with each of the nanowires having a substantially vertical section in the slab in the support layer, are isolated from the horizontal section on the slab, which can therefore be electrically contacted, such that for example, an electrical nanowire circuit is provided, in particular where the active part of the circuit is part of the horizontal section on the slab.

DESCRIPTION OF DRAWINGS

FIGS. 10a-c show images of a device based on the presently disclosed nanowire networks.

FIG. 10a shows an image of a characterization setup of a nanowire network on a support layer, corresponding to the setup in FIG. 9a.

Please note that the respective aspect ratios in the illustrations are not a representation of actual sizes.

DETAILED DESCRIPTION OF THE INVENTION

The present disclosure is at least partly related to control of the direction of nanowire growth which may be based on well-known vapor-liquid-solid (VLS) growth.

Growth

In one embodiment of the disclosed method, nanowire growth is initiated from controlled and ordered positions on the plane substrate. When using VLS growth metallic catalysts, such as gold droplets/particles, may be positioned on a substrate and the positions of the metallic catalysts determine the initial growth positions of the nanowires from the substrate. Hence, according to the presently disclosed method, the positions of the metallic catalysts are preferably chosen very carefully. To illustrate this, the catalysts may be placed in such a way that if some or all of the nanowires are kinked, as according to the presently disclosed method, the nanowires will intersect each other in the plane parallel to the substrate, thereby creating the one or more network(s) of interconnected kinked nanostructures in the plane parallel to the substrate. The placement of the position of the catalysts may for example be provided by means of a CAD program, illustrating that the positions of the catalysts indeed are chosen very carefully. Under appropriate growth conditions, the intersecting nanowires may covalently bond at their intersection In some embodiments, the substrate is a single-crystal substrate. In other embodiments, the nanowires are single crystal. In preferred embodiments, the nanowires have the same or higher symmetry as the substrate, for example along the substrate normal. Having such a configuration may allow for nanowire intersections that are epitaxial.

Elongated Nanostructures and Epitaxial Match

In one embodiment of the presently disclosed method the elongated nanostructures are initially growing in a direction perpendicular to the substrate. In this way, the nanostructures are initially growing upwards from the substrate. Nanostructures are thereby provided that are not initially in the plane of the substrate. The elongated nanostructures have per se a first dimension, at least along the growth direction. Thus, the first dimension, relating to a height, may be application-dependent. Thus, a flexible application-dependent network may be provided by the presently disclosed method.

In another embodiment of the disclosed method, the elongated nanostructure is a crystalline semiconductor nanostructure. An advantage of having crystalline semiconductor nanostructure is that it may allow for growth based on vapor-liquid-solid growth, wherein a metallic nanoparticle catalysts the nanowire growth.

The presently disclosed method is compatible with heterostructured nanostructures composed of different materials, including a variety of semiconductors and semiconductor-metal material combinations. In a preferred embodiment of the disclosed method and/or network, the elongated nanostructure therefore comprises a crystalline semiconductor nanostructure and a crystalline structured first facet layer of a of superconductor material and wherein the crystalline structure of the semiconductor nanostructure is epitaxially matched with the crystalline structure of the first facet layer on the interface between the two crystalline structures. The first facet layer (and subsequent facet layers) can be deposited after the growth direction of the elongated nanostructures have been kinked, such that for example the facet layer(s) are only formed on the kinked ('horizontal') part of the elongated nanostructures.

In particular, the semiconductor-metal hybrid nanowires are useful for the creation of hard-gap gateable superconductors. In preferred further embodiment of the disclosed method and/or network, the epitaxial match between the crystalline structures of the semiconductor nanostructure and the first facet layer is therefore configured to induce a superconductor hard gap in the semiconductor nanostructure. A hard gap is an important feature for detecting and controlling quantum computation in topological systems. Networks of superconductor-semiconductor hybrid devices are important for realizing topologically protected quantum circuits based on majorana fermions. Such networks require intersections for topological braiding operations that are needed to evolve the quantum state within the network. Thus, a quantum computational nanowire network may be provided by the presently disclosed method and/or disclosed network. This is further disclosed in pending applications WO 2016/000836 and WO 2016/001365 which are hereby incorporated by reference in their entirety.

Epitaxial match in the interface between two crystalline layers may not be entirely unusual if the crystal structures of the two crystalline layers are equal. However, in this case the inventors have demonstrated that an epitaxial interface can be realised even when the crystal structure (and/or crystal phase) of the elongated crystalline nanostructure is different from the crystal structure (and/or crystal phase) of the first facet layer, such as when the crystal structure (and/or crystal phase) of the elongated crystalline nanostructure and the crystal structure (and/or crystal phase) of the first facet layer belong to different lattice systems and/or if the Bravais lattice of the elongated crystalline nanostructure is different from the Bravais lattice of the facet layer.

As herein disclosed, the networks of interconnected nanostructures and/or the nanowire network and/or the nanowire circuit, or simply the nanostructures, may form a plane, in particular because the nanostructures, according to the disclosed method, may be grown parallel to the plane substrate. Accordingly, the disclosed method may be repeated in order to create one or more networks of interconnected nanostructures in one or more additional plane(s) being parallel to but displaced from the plane.

As further disclosed herein, the network of nanowires may be a network as described above and in the following. The nanowire network as also disclosed herein may further comprise a substrate supporting the slab opposite the network of nanowires.

Crystalline Semiconductor

A nanostructure in the form of a crystalline semiconductor nanostructure may be provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations. However, the elongated crystalline nanostructure may be provided in a metal or insulator material.

In another embodiment of the disclosed method and/or network, the cross-section of the crystalline semiconductor nanostructure is square providing a total of four side facets or hexagonal providing a total of six side facets. The number of side facets may determine allowed connections in the network. It is clear that four side facets may provide four connections, and six side facets may provide six connections. In some embodiments, the four connections may be preferred over the six connections, and vice versa in other embodiments. Six connections may however provide various connection possibilities in networks, for example honeycomb structured networks. According to the disclosed method, the growth direction is kinked, meaning that the metallic catalyst is forced to move to one of the side facets, and thereby to grow along one of the possible side facets. As previously described, the growth may be initiated from ordered positions, meaning that the ordered positions may be determined by the cross-section of the crystalline semiconductor nanostructure.

Kinking

There are several techniques that may cause the growth direction of nanowires to change, i.e. to kink the nanowires during growth. Typical methods arise from changes in the vapor-liquid-solid (VLS) growth condition. The presently disclosed method may as well be provided from changes in the vapor-liquid-solid (VLS) growth condition. The kinking itself is well-known, but in combination with the support layer, is provided a new method and device. Further, also in combination with ordered positions of where the elongated nanostructures are initiated, is provided a new and improved nanowire network and method for manufacturing of such. Three known methods for kinking the nanowires are described in the following.

Change of crystallographic growth direction may be achieved by changing the incoming fluxes or partial pressures, such that the liquid phase will change in size, which makes the liquid move onto another crystal facet. As an example for the case of III-V nanowires: Turning off the Group V source abruptly will increase the liquid phase volume by an increase in the number group III atoms.

Change of crystallographic growth direction may be achieved by changing the substrate temperature, such that the liquid phase will change in size due to a change in the thermodynamic driving forces. This can also make the liquid move onto another crystal facet. As an example for the case of III-V nanowires, turning off the Group III material while decreasing temperature will change growth conditions. When increasing the temperature, the wetting conditions will change for another direction.

Change of crystallographic growth direction may be achieved by introducing a short pulse of different material. The change in composition can change the wetting conditions and promote a new growth direction. As an example, a Gallium (Ga) pulse is introduced to an upwardly growing nanowire, for example a nanowire catalysed by a gold seed. As a consequence, and due to surface kinetics, i.e. in order to minimize interface energies, the gold seed is forced to move to one of the side facets of the upwardly growing nanowire, thereby kinking the nanowire.

In relation to the herein disclosed method, kinking the growth direction of at least a part of the nanostructures is preferably achieved by the change of substrate temperature. However, kinking the growth direction may be by any of the above mentioned methods.

Support Layer

In one embodiment of the presently disclosed method, the support layer is applied by means of resist spinning. In that case the dielectric support layer may be a polymeric material, such as a negative UV resist, such as for example SU8. SU8 is a commonly used epoxy-based negative photoresist. Negative refers to a photoresist whereby the parts exposed to UV become cross-linked, while the remainder of the film remains soluble and can be washed away during development. However, in alternative embodiments of the presently disclosed method, the support layer material is glass.

The support layer is preferably configured to envelope the first "vertical" part of the elongated nanostructures, for instance the stem of kinked nanowires, for example having a crystalline direction known as [1 1 1]. According to the presently disclosed method, the support layer is configured to support said network(s) of interconnected nanostructures, i.e. constitute a plane supporting layer for the network(s) of nanostructures, i.e. the support layer supports the kinked "horizontal" part of the nanostructures. This part may for example a crystalline direction perpendicular to the [1 1 1]-direction, e.g. along the [1 1 2]-direction.

The presently disclosed method may further comprise the step of exposing the support layer to light, such as UV light, in particular when the support layer is a negative UV resist. This may be provided for making the layer sufficiently resilient to chemical treatment.

The presently disclosed method may further comprise the step of baking the support layer, preferably by a method known as hard baking. This may be for making the layer hard enough such that a metal may be processed on the layer, thereby allowing the nanowires to be electrically contacted.

Another advantage of hard baking is that a hard baked dielectric support layer with one or more networks of interconnected nanostructures on top thereof, can be removed from the growth substrate, for example by scraping off the hard baked support layer. The hard baked support layer can then be transferred to another substrate, for example a standard silicon substrate with non-conductive properties in the surface ensuring that the network(s) of nanostructures on the hard baked resist surface are only conductively connected through interconnections in the network plane.

In one embodiment of the presently disclosed method, the support layer is gradually applied to control the height of the support layer, such that the height of the support layer corresponds to the distance between the substrate and the nanostructure network. The height of the support layer may be of importance in order to correctly process metal contact, alignment marks or gates thereon. In spin-on processes, there is typically a linear relationship between layer thickness and spin speed, and it is therefore easy to deduce the height of the layer. However, a direct deduction of the layer height may in general be complicated by the fact that the linear relationship as described could change over time. By the presently disclosed method the nanowires, as grown on the substrate, may to some extent further reduce the flow of solution during the spin on process, and thus a layer height may not be deduced as in typical spin on processes. Therefore, in order to control the height of the support layer, the height may be determined in the gradual process. For example, the gradual process may comprise a set of spin cycles such that each spin cycle applies one or more layers at a given spin speed and spin duration. In between each spin cycle the exact height may for example be determined using a scanning electron microscope.

In one embodiment of the presently disclosed method, the distance is determined by means of an electron microscope having exposure energy of 10 kV or less than 10 kV.

In one embodiment of the presently disclosed method, the height of the support layer is determined by depositing a contact layer on the nanostructure network(s) and the support layer, determining the distance between the substrate and the contact layer and subsequently removing the contact layer.

The height of the support layer may be in a range between a few nanometers and up to several micrometers, e.g. between around 20, 50 or 100 nm and up to 1, 2 or 3 µm.

Preferably, the method may further comprise the step of cleaning the network(s) and/or the support layer using plasma etching and/or ashing. In this way it may be possible to clean the network such that is free of resist, for example if the support layer has been applied such that it is extending beyond the network plane or if the support layer has been applied on parts of the kinked network.

In some embodiments of the presently disclosed method, the step of applying a dielectric support layer is provided after the step of growing a plurality of elongated nanostructures from the substrate. However, in other embodiments of the presently disclosed method, the step of applying a dielectric support layer is provided before the step of growing a plurality of elongated nanostructures from the substrate. For example, it may be possible to use a layer of patterned hexagonal boron nitride (h-BN), which allows for the nanowires to be kinked right at the surface of the dielectric.

As also described above the support layer may be the top surface of the substrate itself, at least in the case where the substrate (surface) material is insulating.

Superconductor Material and First Facet Layer

In one embodiment of the presently disclosed method and network, the superconductor material and/or the first facet layer is a metal, such as Al.

In another embodiment of the presently disclosed method and network, the superconductor material and/or the first facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

In yet another embodiment of the presently disclosed network, the epitaxial match between the crystalline structures of the semiconductor nanostructure and the first facet layer is configured to induce a superconductor hard gap in the semiconductor nanostructure with the superconducting properties of the second facet layer.

In one embodiment, the thickness of the first facet layer is less than 20 nm, or less than 10 nm, more preferred less than 8 nm, more preferred less than 6 nm, more preferred less than 5 nm.

In a second embodiment, the thickness of the first facet layer is less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

Second Facet Layer

In one embodiment of the disclosed network, the network further comprises a second facet layer of a superconductor material covering at least a part of the first facet layer. The second facet layer is preferably different from the first facet layer, e.g. the material of the second facet layer may be different from the material of the first facet layer.

In another embodiment of the disclosed network, the second facet layer has a crystalline structure which is not epitaxially matched with the crystalline structure of the semiconductor nanostructure or with the crystalline structure of the first facet layer. In a preferred embodiment of the disclosed network, the second facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

In another preferred embodiment of the disclosed network, the second facet layer is an alloy, such as an alloy selected from the group of $MgB_2$, niobium alloys, such as NiTi, NbTiN with various fractions of Ti and N, and $Zr_{100-x}M_x$ where x is any number in the range of 0 to 100 and M is a metal selected from the group of Fe, Co, Ni, Cu, Ru, Rh, Pd, Os, Ir, Pt and Au. In yet another preferred embodiment, the second facet layer is a ceramic material, such as selected from the group of cuprates, such as YBCO ($YBa_2Cu_3O_{7-x}$). The critical temperature of the material of the second facet layer is preferably different than the critical temperature of the first facet layer.

Third Facet Layer

In one embodiment of the presently disclosed network, the network further comprises a third facet layer located between the first facet layer and the second facet layer. The third facet layer is preferably different from the first and the second facet layers, for instance the material of the third facet layer may be different from the material of the first and the second facet layers. The third facet layer may be provided in an inert material, such as an inert metal, selected from the group of gold, platinum, iridium, palladium, osmium, silver, rothenium and rhodium. Preferably, the thickness of the third facet layer may be between 3 and 10 nm, or less than 10 nm, or less than 5 nm, or less than 4 nm, or less than 3 nm, or less than 2 nm, or less than 1 nm.

Example 1—A Nanowire Network

Figure 1:
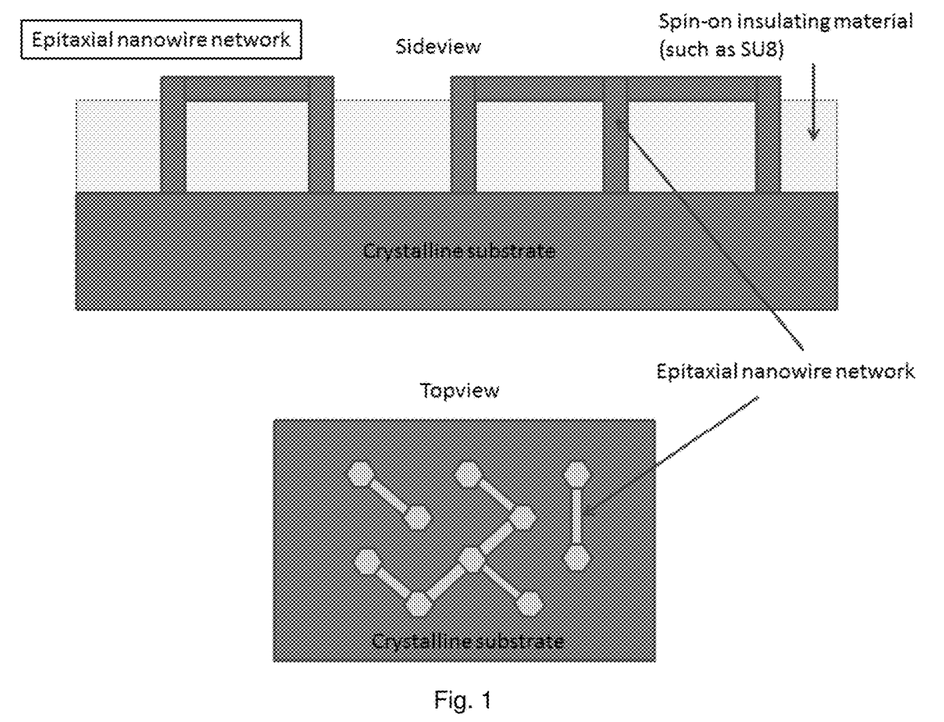
FIG. 1 shows an example of a nanowire network as seen from a side view and a top view.

FIG. 1 shows an illustrative example of a nanowire network according to the present disclosure. The nanowire network comprises nanowires that are of a crystalline semiconductor nanostructure, where the cross section of the nanostructures are hexagonal, providing a total of six side facets for each nanowire (to be seen from top view). There is a support layer between the substrate and network plane (to be seen from side view).

Example 2—Initial Support Layer

Figure 2:
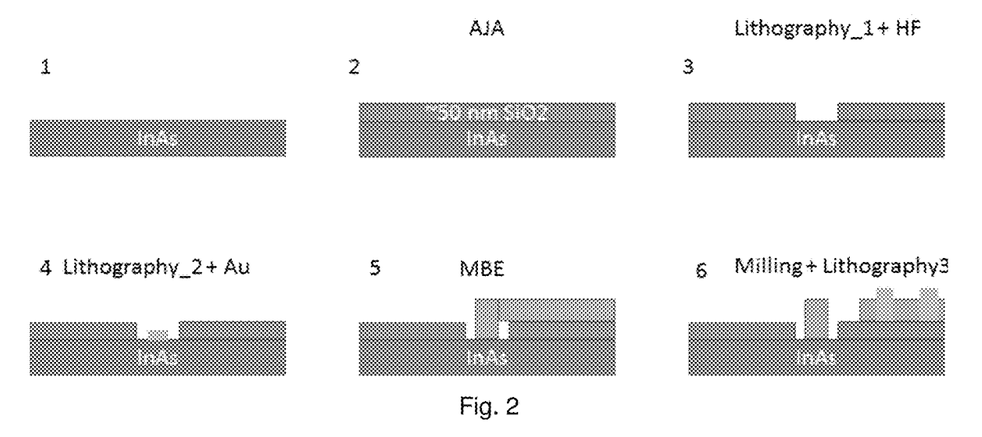
FIG. 2 shows an exemplary process for producing a nanowire network.

FIG. 2 shows an illustrative example of the presently disclosed method of producing a nanowire network. The dielectric support layer is provided initially on an InAs substrate in the form of approx. 50 nm $SiO_2$. To expose the InAs again selected parts of the support layer are removed by means of lithography and HF. In another lithography step Au catalyst particles/droplets are added to the exposed parts of the substrate. Elongated nanostructures can then be grown by means of MBE and VLS perpendicular to the substrate at the locations of the Au particles. When the appropriate height is reached the growth direction can be kinked such that the nanostructures grow parallel to the substrate on top of the support layer to create interconnected networks. In this case the InAs substrate is a conductor and the connection between the vertical part of the nanowire (the stem) and the horizontal part must be removed or cut-off to avoid parallel currents through the conducting InAs substrate. This can be provided by means of Argon milling which can be applied in general to cut-off the connection between the stem and the horizontal part of kinked elongated nanostructures. Subsequent lithography can configure the networks and/or build devices.

If a non-conducting substrate was used, e.g. a standard processing wafer, e.g. $Si/SiO_2$, the dielectric support layer can be formed by the surface of the substrate itself. Recesses/dints/holes can then be provided in the surface of the substrate, like in step 2 and 3 in FIG. 2, and after providing a catalyst, like Au particles, elongated nanostructures can be grown, initially perpendicular to the substrate and subsequently parallel with and on the surface of the substrate. In that case it may not be necessary to cut the connection between the vertical stem and the horizontal part because the substrate is not conducting.

Example 3—Resist Support Layer

Figure 3:
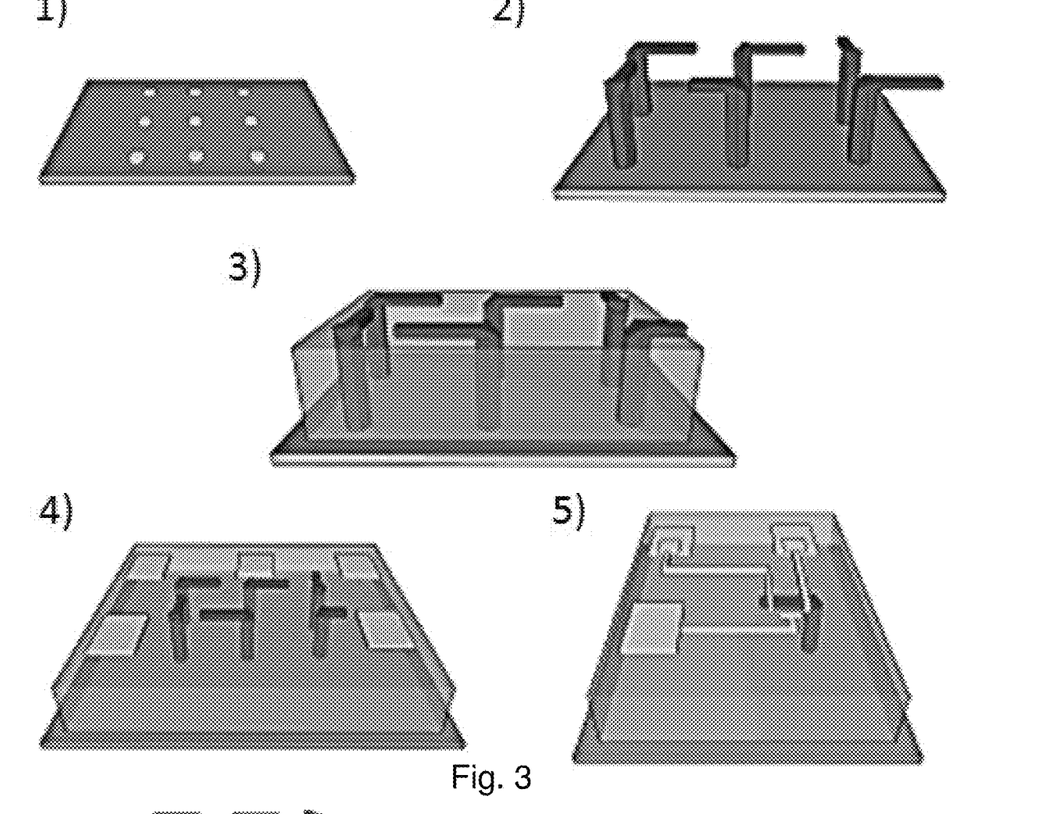
FIG. 3 shows another exemplary process for producing a nanowire network.

FIG. 3 shows another illustrative example of the presently disclosed method of producing a nanowire network. Initially the Au-catalyst droplets are fabricated and positioned on the substrate. The elongated nanostructures, in the form of InAs nanowires, are grown initially perpendicular to the substrate and at some point they are kinked to grow parallel to the substrate. In step 3) a photosensitive resist is applied to an appropriate height to support the parallel part of the nanowires. O$_2$ plasma ashing of the resist can be employed to reduce the height of the resist such that only the stem of the nanowires are covered in resists. The resist can subsequently be hardened. Step 4 illustrates the application/ machining of the bonding pads and alignments marks. Step 5 illustrates processing of contacts from the bonding pads to one of the nanowires.

Example 4—Appropriate Height of Support Layer

Figure 4:
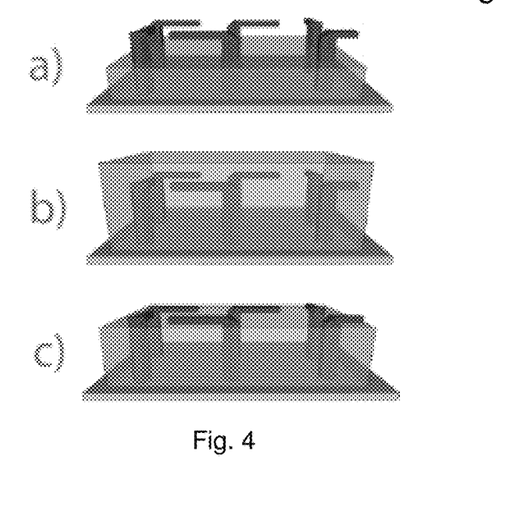
FIG. 4 shows an exemplary selection of the appropriate height of the support layer.

FIG. 4 is an illustration on how the height of the support layer can be manipulated in order to support the nanowire networks. In a) a resist layer is being applied by resist spinning; after each spin cycle the actual height can be verified using electron micrography. In b) the resist layer is slightly covering the kinked part of the nanowires and the sample is ready for O$_2$ plasma ashing. In c) the right amount of resist is found via the process of O$_2$ plasma ashing and by examining the height of the resist layer continually, such that a functioning support layer supporting the nanowires is provided.

Example 5a—A Manufactured Nanowire Network

Figure 5A:
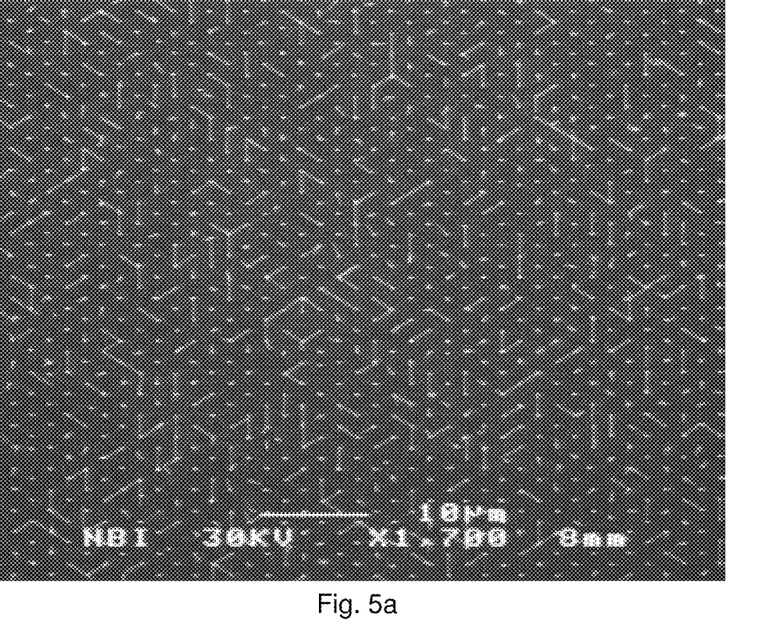
FIG. 5a shows a scanning electron microscopy image of a manufactured nanowire network.

FIG. 5a shows a scanning electron microscopy image of a manufactured nanowire network as grown on a substrate wherein a part of the nanowires are kinked to become parallel with the substrate. The kinked part of the nanowires is seen as the connection between the spots, the spots being nanowires perpendicular to the substrate as seen from above. In this particular example, the kinking is obtained using a pulse of another material as described in the detailed description.

Example 5b—Close Up of a Kinked Nanowire

Figure 5B:
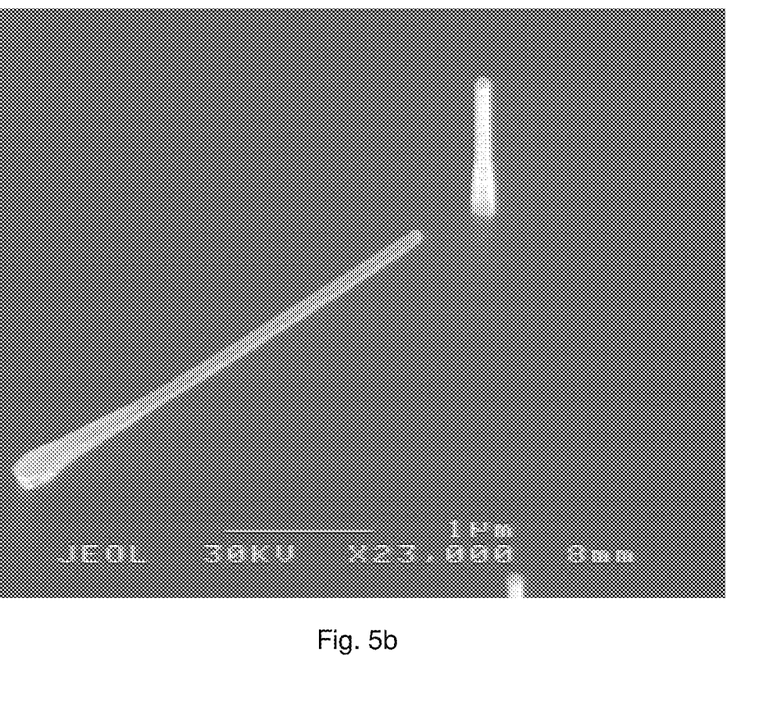
FIG. 5b shows an image of the top part of a nanowire in a nanowire network.

FIG. 5b shows a close up image of a kinked nanowire. Below the kinked nanowire is a spin-on resist, in this case SU8. The top of the nanowire that is parallel to the substrate is free of resist due to a subsequent plasma etch.

Example 6—A Nanowire Circuit

Figure 6:
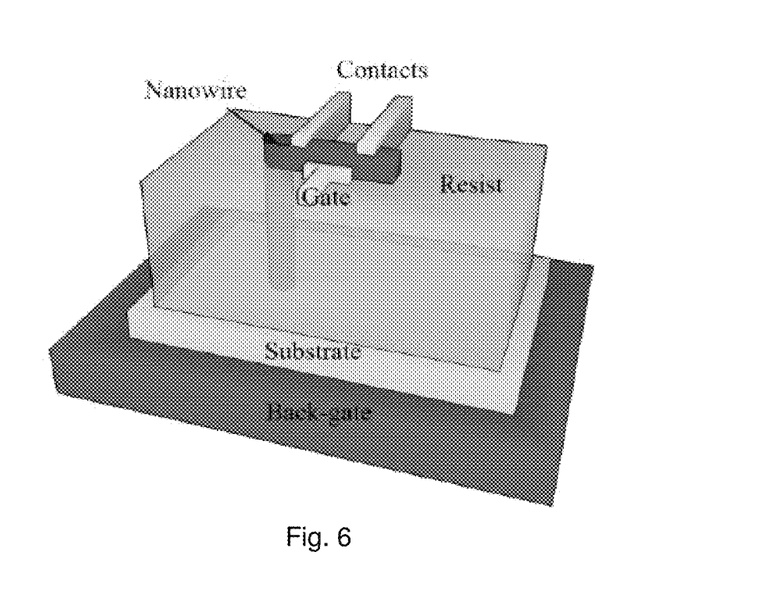
FIG. 6 shows an example of a nanowire circuit.

FIG. 6 shows an illustrative example of a nanowire circuit, in this case a single component device, having a nanowire that is parallel to the substrate, two electrical contacts and a gate (processed on the support/resist layer and the nanowire).

Example 7—A Nanowire Circuit

Figure 7:
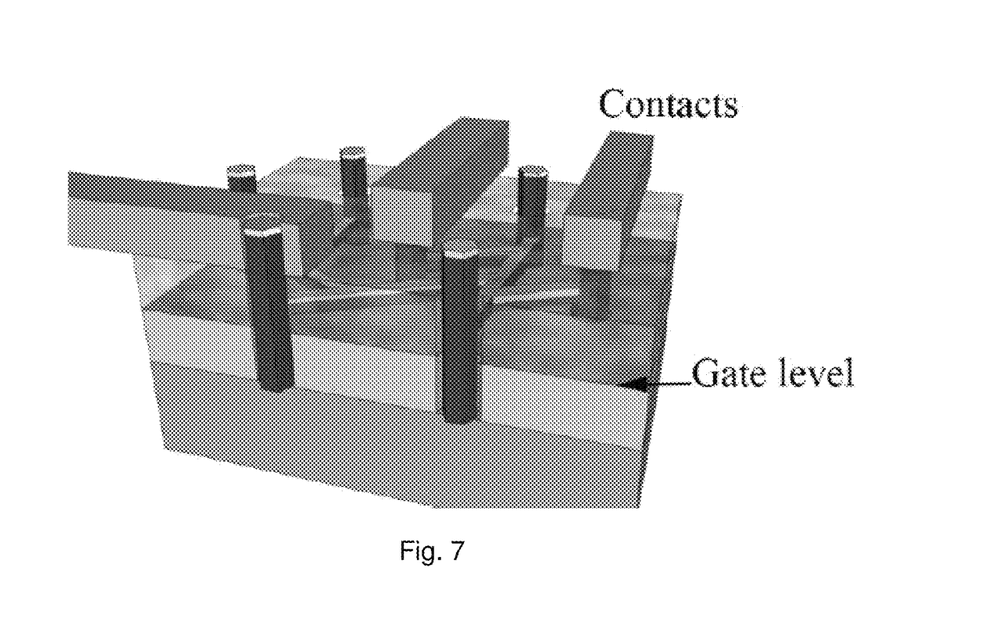
FIG. 7 shows another example of a nanowire circuit.

FIG. 7 shows an illustrative example of another nanowire circuit, in this case a device, where the bias and gate voltage are separated in two separate layers.

Example 8—Experimental Realization and Measurements

Figure 8A:
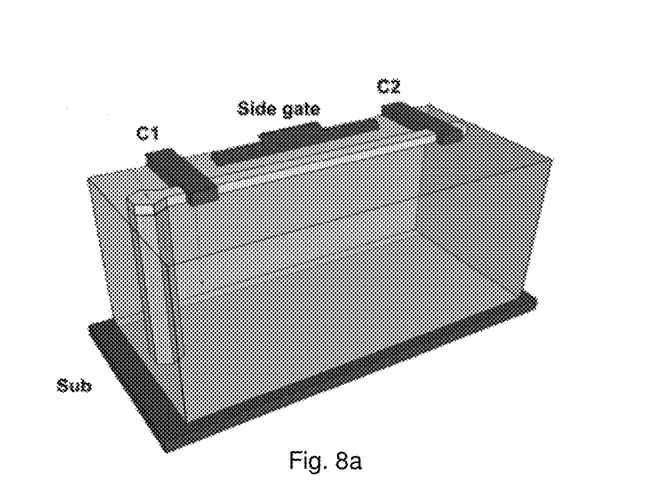
FIG. 8a-c shows an example of a nanowire circuit and measurements conducted on said circuit.
Figure 8B:
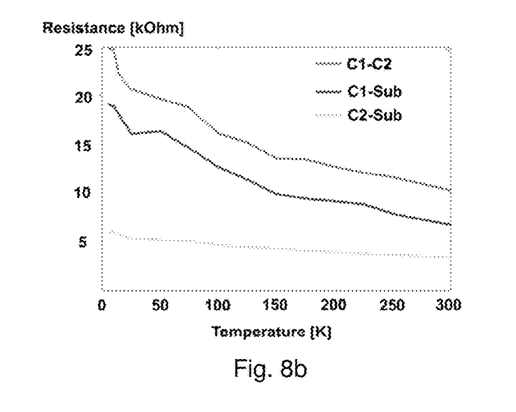
Figure 8C:
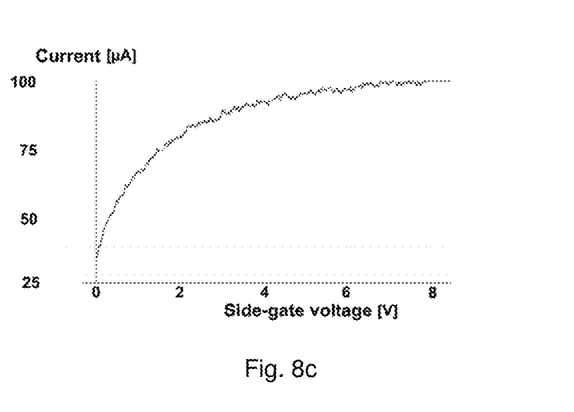
Figure 9A:
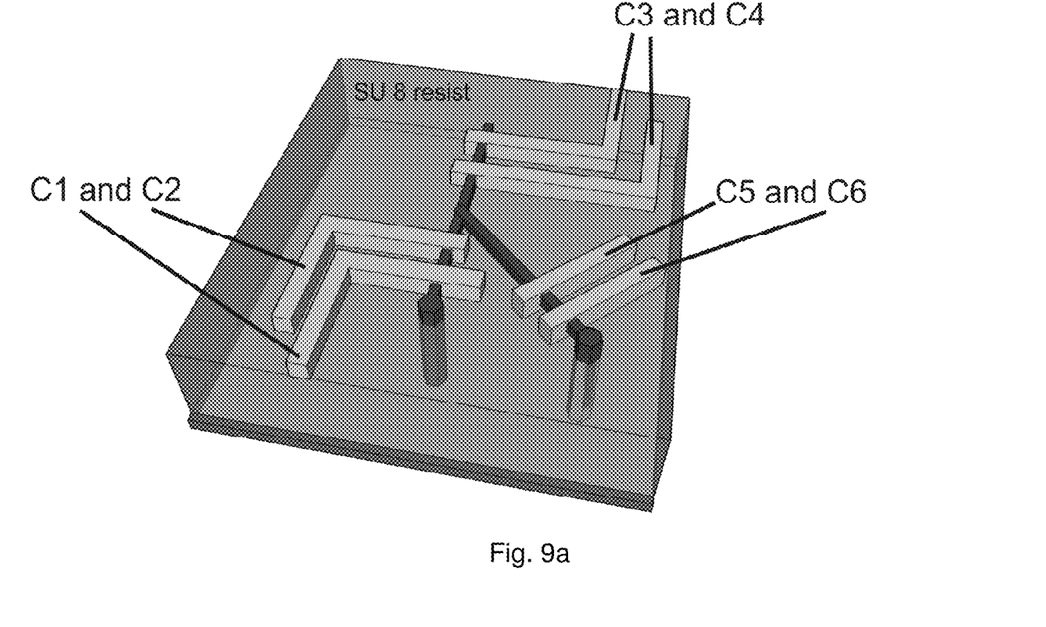
FIG. 9a shows an illustrative example of a characterization setup of a nanowire network on a support layer.
Figure 9B:
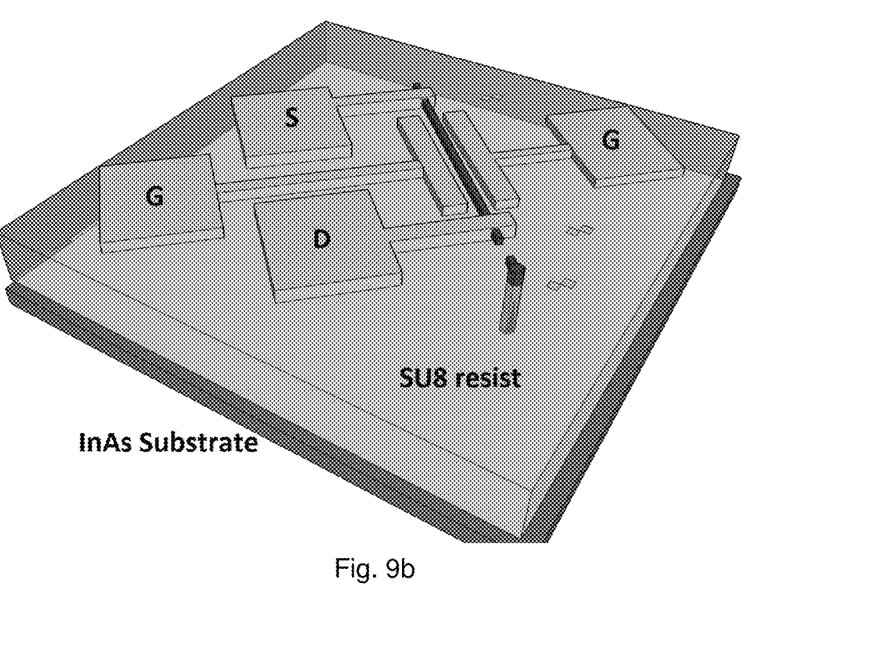
FIG. 9b illustrates a broken connection between the stem and the horizontal part of a nanowire on a support layer.
Figure 10A:
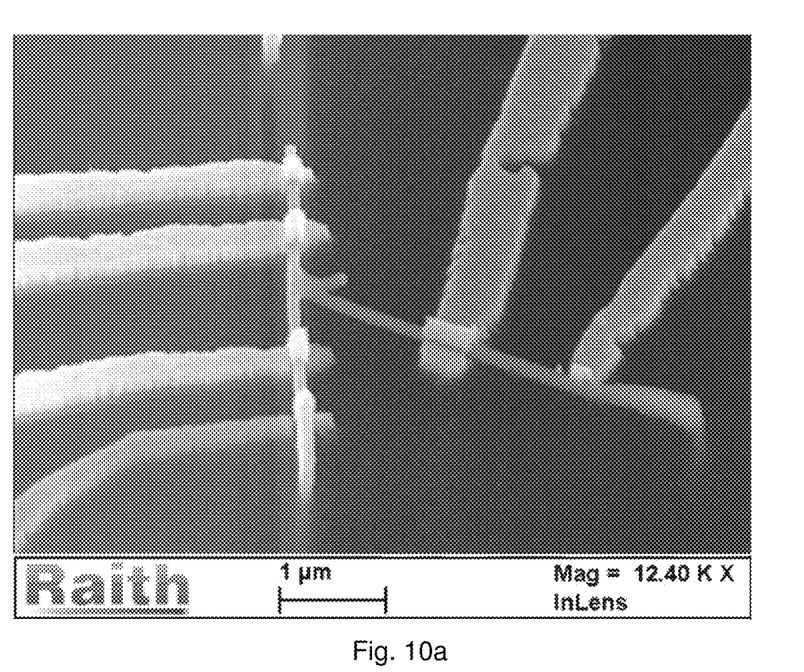
Figure 10B:
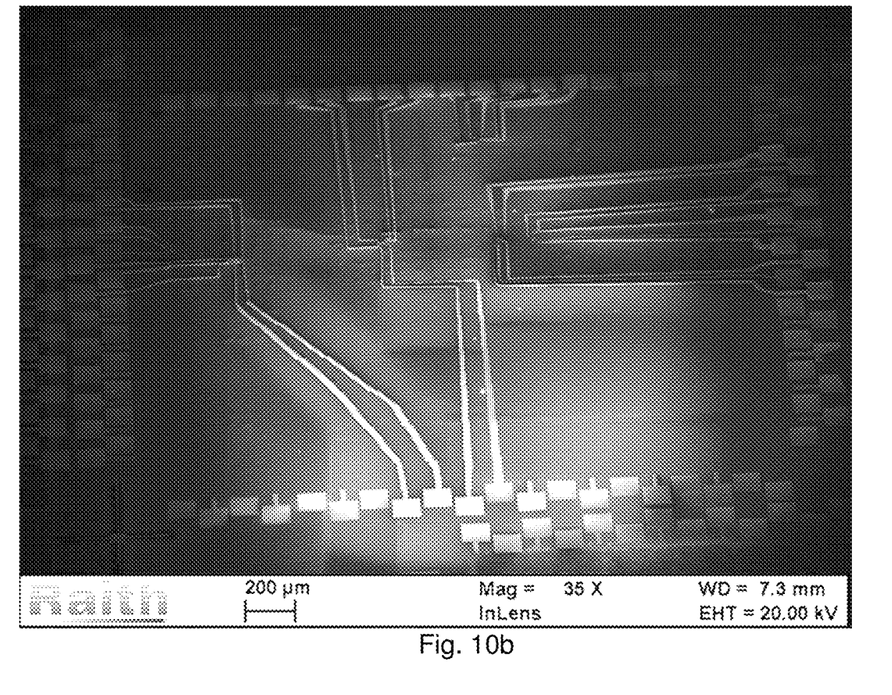
FIG. 10b shows an image of several nanowire networks according to the present disclosure that are interconnected.
Figure 10C:
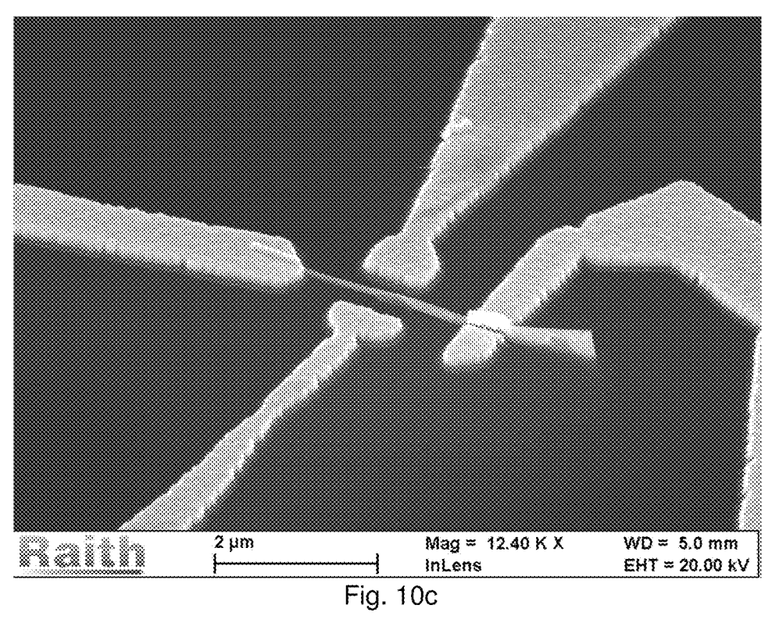
FIG. 10c shows an image of an exemplary nanowire network device according to the present disclosure with sidegates.

FIGS. 8b-c shows experimental results conducted on an experimental realization of the presently disclosed nanowire network/nanowire circuit. A nanowire circuit as illustrated in FIG. 8a was manufactured. The resistance between the contacts, C1 and C2, and the substrate, Sub, was measured (see the graph on the left) while being cooled down to see if different thermal expansion of the substrate and the support layer would cause the circuit to break. This was not an issue, thus illustrating a working device. As seen in the graph on the right, an effective response from a side gate was also demonstrated.

Further Details

The following numbered items describe further details of the present disclosure.

1. A method for producing a network of interconnected nanostructures comprising the steps of:
   providing a substantially plane substrate;
   growing a plurality of elongated nanostructures from the substrate;
   kinking the growth direction of at least a part of the nanostructures such that at least part of the kinked nanostructures are growing in a network plane parallel to the substrate,
   wherein a dielectric support layer is provided below the network plane.
2. The method according to item 1, further comprising the step of creating one or more network(s) of interconnected kinked nanostructures in the network plane, such that said network(s) can be supported by the dielectric support layer.
3. The method according to any of the preceding items, wherein kinked nanostructures growing in the network plane thereby interconnect to form one or more networks of conductively interconnected kinked nanostructures in the network plane.
4. The method according to any of the preceding items, wherein at least a part of the kinked nanostructures are grown directly on said dielectric support layer.
5. The method according to any of the preceding items, wherein at least a part of the interconnected kinked nanostructures are grown directly on said dielectric support layer.
6. The method according to any of the preceding items, wherein each of said network(s) are only conductively connected in the network plane through corresponding interconnected kinked nanostructures
7. The method according to any of the preceding items, wherein the elongated nanostructures initially (before the step of kinking the growth direction) are growing in a direction perpendicular to the substrate.
8. The method according to any of the preceding items, wherein the elongated nanostructure is a crystalline semiconductor nanostructure.
9. The method according to item 8, wherein the elongated nanostructure comprises a crystalline semiconductor nanostructure and a crystalline structured first facet layer of a of superconductor material and wherein the crystalline structure of the semiconductor nanostructure is epitaxially matched with the crystalline structure of the first facet layer on the interface between the two crystalline structures.
10. The method according to any of the items 8-9, wherein the elongated nanostructure comprises a crystalline semiconductor nanostructure and a crystalline structured first facet layer of a of superconductor material and wherein the crystalline structure of the semiconductor nanostructure is epitaxially matched with the crystalline structure of the first facet layer on the interface between the two crystalline structures.
11. The method according to any of the items 8-10, wherein the epitaxial match between the crystalline structures of the semiconductor nanostructure and the first facet layer is configured to induce a superconductor hard gap in the semiconductor nanostructure.

12. The method according to any of the items 8-11, wherein the crystalline semiconductor nanostructure is provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.

13. The method according to any of the items 9-12, wherein the superconductor material and/or the first facet layer is a metal, such as Al.

14. The method according to any of the items 9-13, wherein the superconductor material and/or the first facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

15. The method according to any of the items 8-14, wherein the cross-section of the crystalline semiconductor nanostructure is square providing a total of four side facets or hexagonal providing a total of six side facets.

16. The method according to any of the preceding items, wherein the dielectric support layer is formed by the top layer/surface of the substrate and wherein each of one or more or all of the elongated nanostructures initially is grown from a recess/dint (formed) in the substrate.

17. The method according to any of the preceding items 16, wherein the network plane is abutting the surface plane of the substrate.

18. The method according to any of the preceding items 16-17, wherein said recesses/dints are formed in predefined areas of the substrate prior to growth, such by means of lithography.

19. The method according to any of the preceding items 16-18, wherein the substrate is a standard processing wafer, such as a wafer based on Si/SiO$_2$, Si/BN, InAs/SiO$_2$ or InAs/BN.

20. The method according to any of the preceding items, wherein the dielectric support layer is applied to the substrate after growth of the elongated nanostructures but before the step of kinking the growth direction.

21. The method according to any of the preceding items, wherein the support layer is located between the top surface of the substrate and the network plane such that the network plane is displaced from the surface plane of the substrate.

22. The method according to any of the preceding items, wherein the dielectric support layer is applied to the substrate before growth of the elongated nanostructures.

23. The method according to any of the preceding items 22, wherein one or more of the elongated nanostructures are grown from a recess/dint formed in the support layer.

24. The method according to any of the preceding items 22-23, wherein the dielectric support layer is removed from the substrate in predefined areas to form recesses/dints in the support layer, such by means of lithography, and wherein the elongated nanostructures are grown from the substrate in at least a part of said predefined areas.

25. The method according to any of the preceding items, wherein the dielectric support layer is applied to the substrate after the network(s) of interconnected kinked nanostructures has been created.

26. The method according to any of the preceding items, wherein the support layer is applied by means of resist spinning.

27. The method according to any of the preceding items, wherein the support layer material is a polymeric material or glass.

28. The method according to any of the preceding items further comprising the step of exposing the support layer to light, such as UV light.

29. The method according to any of the preceding items, wherein the support layer material is an insulating material, such as SiO$_2$ or hexagonal BN.

30. The method according to any of the preceding items further comprising the step of baking the dielectric support layer.

31. The method according to any of the preceding items 30, further comprising the step of removing the hard baked dielectric support layer and the network(s) thereupon and transferring these to a second substrate.

32. The method according to any of the preceding items 25-30, further comprising the step of cleaning the network(s) and/or the support layer using plasma etching and/or ashing.

33. The method according to any of the preceding items 25-32, wherein the support layer is gradually applied to control the height of the support layer, such that the height of the support layer corresponds to the distance between the substrate and the nanostructure network.

34. The method according to any of the preceding items 25-33, wherein the height of the support layer is provided by depositing a contact layer on the nanostructure network(s) and the support layer, determining the distance between the substrate and the contact layer and subsequently removing the contact layer.

35. The method according to item 34, wherein said distance is determined by means of an electron microscope having an exposure energy of 10 kV or less than 10 kV.

36. The method according to any of the preceding items, wherein the method is repeated in order to create one or more networks of interconnected nanostructures in an third plane being parallel to but displaced from said network plane.

37. A nanowire network produced by the method according to any of the items 1-36.

38. A network of interconnected nanowires, wherein the at least a part of the nanowires comprise a crystalline semiconductor nanostructure and a crystalline structured first facet layer of a of superconductor material and wherein the crystalline structure of the semiconductor nanostructure is epitaxially matched with the crystalline structure of the first facet layer on the interface between the two crystalline structures.

39. The network according to item 38, wherein the epitaxial match between the crystalline structures of the semiconductor nanostructure and the first facet layer is configured to induce a superconductor hard gap in the semiconductor nanostructure.

40. The network according to any of the items 38-39, wherein the crystalline semiconductor nanostructure is provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.
41. The network according to any of the items 38-40, wherein the nanowire network form a plane.
42. The network according to any of the items 38-41, wherein the superconductor material and/or the first facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.
43. The network according to any of the items 38-42, wherein the cross-section of the crystalline semiconductor nanostructure is square providing a total of four side facets or hexagonal providing a total of six side facets.
44. The network according to any of the items 38-43, further comprising a second facet layer of a superconductor material covering at least a part of the first facet layer, the second facet layer being different that the first facet layer, such as provided in a different material.
45. The network according to item 44, wherein the second facet layer has a crystalline structure which is not epitaxially matched with the crystalline structure of the semiconductor nanostructure or with the crystalline structure of the first facet layer.
46. The network according to any of the items 44 to 45, wherein the critical temperature of the material of the second facet layer is higher than the critical temperature of the first facet layer.
47. The network according to any of the items 44 to 46, wherein the epitaxial match between the crystalline structures of the semiconductor nanostructure and the first facet layer is configured to induce a superconductor hard gap in the semiconductor nanostructure with the superconducting properties of the second facet layer.
48. The network according to any of the items 44 to 47, wherein the thickness of the first facet layer is less than 20 nm, or less than 10 nm, more preferred less than 8 nm, more preferred less than 6 nm, more preferred less than 5 nm.
49. The network according to any of the items 44 to 48, further comprising a third facet layer located between the first facet layer and the second facet layer.
50. The network according to any of the item 49, wherein the third facet layer is provided in an inert material, such as an inert metal, selected from the group of gold, platinum, iridium, palladium, osmium, silver, rothenium and rhodium.
51. The network according to any of preceding items 49 to 50, wherein the thickness of the third facet layer is between 3 and 10 nm, or less than 10 nm, or less than 5 nm, or less than 4 nm, or less than 3 nm, or less than 2 nm, or less than 1 nm.
52. The network according to any of preceding items 44 to 51, wherein the second facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.
53. The network according to any of preceding items 44 to 52, wherein the second facet layer is an alloy, such as an alloy selected from the group of $MgB_2$, niobium alloys, such as NiTi, NbTiN with various fractions of Ti and N, and $Zr_{100-x}M_x$ where x is any number in the range of 0 to 100 and M is a metal selected from the group of Fe, Co, Ni, Cu, Ru, Rh, Pd, Os, Ir, Pt and Au.
54. The network according to any of preceding items 44 to 52, wherein the second facet layer is a ceramic material, such as selected from the group of cuprates, such as YBCO ($YBa_2Cu_3O_{7-x}$).
55. The network according to any of preceding items, wherein the thickness of the first facet layer is less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.
56. A nanowire circuit, comprising:
   a dielectric support layer forming a slab; and
   a plurality of nanowires, each having a substantially vertical section in the slab and a horizontal section on the slab, wherein at least a part of the horizontal sections are interconnected to form a network of nanowires.
57. The nanowire circuit according to item 56, further comprising a substrate supporting the slab opposite the network of nanowires.
58. The nanowire circuit according to item 56, further comprising substrate wherein the surface layer of the substrate forms the slab, such that the vertical section of the nanowires extend into the surface layer of the substrate.
59. The nanowire circuit according to any of the items 56-57, wherein the support layer material is a polymeric material or glass.
60. The nanowire circuit according to any of the items 56-57, wherein the network of nanowires is a network according to any of the items 38-55.

The invention claimed is:
1. A method for producing one or more networks of interconnected nanostructures as grown on a substrate, the method comprising the steps of:
   providing a substantially plane substrate;
   growing a plurality of elongated nanostructures on the substrate in a direction substantially perpendicular to the substrate,
   changing the growth direction of at least a part of the nanostructures resulting in kinked nanostructures are growing in a network plane parallel to the substrate, at least a part of the kinked nanostructures thereby interconnect to form one or more networks of conductively interconnected kinked nanostructures in the single network plane,
   wherein a dielectric support layer is provided below the single network plane enveloping the part of the elongated nanostructures that was grown perpendicular to the substrate, the dielectric support layer configured to support said network(s) of interconnected nanostructures, and wherein each of said networks are conductively interconnected in the single network plane only through corresponding interconnected kinked nanostructures.

2. The method according to claim 1, wherein the elongated nanostructures initially, before the step of kinking the growth direction, are growing in a direction perpendicular to the substrate.

3. The method according to claim 1, wherein the elongated nanostructure is a crystalline semiconductor nanostructure provided in a semiconducting material selected from the group consisting of group III-V combinations, group IV elements, group IV combinations, group II-VI combinations, and group I-VII combinations.

4. The method according to claim 3, wherein the group III-V combinations are selected from the group consisting of InAs, InP, InSb, GaAs, GaSb, AlSb and InGaAs; the group IV elements are selected from the group consisting of Si and Ge; the group IV combinations are SiGe; and the group II-VI combinations are selected from the group consisting of ZnO, ZnSe and CdSe.

5. The method according to claim 1, wherein the substrate is a standard processing wafer.

6. The method according to claim 1, wherein the substrate is a wafer based on $Si/SiO_2$, Si/BN, $InAs/SiO_2$ or InAs/BN.

7. The method according to claim 1, wherein the dielectric support layer is formed by the top surface layer of the substrate such that the network plane is abutting the surface plane of the substrate, and wherein each of one or more or all of the elongated nanostructures initially is grown from a recess/dint formed in predefined areas of the substrate prior to growth of the elongated nanostructure.

8. The method according to claim 1, wherein the dielectric support layer is located between the top surface of the substrate and the network plane such that the network plane is displaced from the surface plane of the substrate.

9. The method according to claim 1, wherein the dielectric support layer is applied to the substrate before growth of the elongated nanostructures and wherein each of one or more or all of the elongated nanostructures initially is grown from a recess/dint formed in predefined areas of the support layer prior to growth of the elongated nanostructure.

10. The method according to claim 1, wherein the dielectric support layer is applied to the substrate after the start of the growth of the elongated nanostructures but before the step of kinking the growth direction.

11. The method according to claim 1, wherein the dielectric support layer is applied to the substrate after the network(s) of interconnected kinked nanostructures has been created.

12. The method according to 9, wherein the support layer is applied by means of resist spinning and wherein the support layer material is a polymeric material.

13. The method according to claim 12, wherein the polymeric material is a negative UV resist.

14. The method according to claim 9, wherein the support layer is gradually applied to control the height of the support layer, such that the height of the support layer corresponds to the distance between the substrate and the nanostructure network.

15. The method according to claim 9, wherein the height of the support layer is provided by depositing a contact layer on the nanostructure network(s) and the support layer, determining the distance between the substrate and the contact layer and subsequently removing the contact layer.

16. A nanowire network produced by the method according to claim 1, wherein the at least a part of the nanowires is a crystalline semiconductor nanostructure having a crystalline structured first facet layer of a superconductor material and wherein the crystalline structure of the semiconductor nanostructure is epitaxially matched with the crystalline structure of the first facet layer on the interface between the two crystalline structures, and wherein the superconductor material and/or the first facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W, and wherein the epitaxial match between the crystalline structures of the semiconductor nanostructure and the first facet layer is configured to induce a superconductor hard gap in the semiconductor nanostructure.

17. The network according to claim 16, wherein the crystalline semiconductor nanostructure comprises a second facet layer of a superconductor material covering at least a part of the first facet layer, the second facet layer being different that the first facet layer, such as provided in a different material, and wherein the second facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

18. The method according to claim 13, wherein the UV resist is SU8.

* * * * *